United States Patent
Kawai

(10) Patent No.: US 6,985,053 B2
(45) Date of Patent: Jan. 10, 2006

(54) NEGATIVE RESISTANCE CIRCUIT

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 49 days.

(21) Appl. No.: 10/767,241

(22) Filed: Jan. 28, 2004

(65) Prior Publication Data

US 2004/0183628 A1     Sep. 23, 2004

(30) Foreign Application Priority Data

Jan. 31, 2003    (JP)    ............................. 2003-023607

(51) Int. Cl.
*H03H 11/52*    (2006.01)
(52) U.S. Cl. .................... 333/217; 333/213; 330/61 A; 330/104
(58) Field of Classification Search ................ 333/213, 333/214, 216, 217; 330/61 A, 103, 104, 330/293; 331/115
See application file for complete search history.

(56) References Cited

U.S. PATENT DOCUMENTS

| | | | |
|---|---|---|---|
| 5,424,686 A * | 6/1995 | Wong et al. ................. | 330/302 |
| 6,573,788 B2 * | 6/2003 | Oppelt ...................... | 330/61 A |
| 6,788,792 B1 * | 9/2004 | Maejima et al. ............ | 381/106 |

* cited by examiner

*Primary Examiner*—Dean Takaoka
(74) *Attorney, Agent, or Firm*—Flynn, Thiel, Boutell & Tanis, P.C.

(57) ABSTRACT

In order to provide a negative resistance circuit which is not influenced by means of change of temperature and source voltage, etc., operates stably and has simple circuit construction, a first stage circuit of the negative resistance circuit is a collector-emitter dividing type amplifying circuit comprising of a npn transistor and a second stage circuit thereof is an emitter earth type amplifying circuit comprising of a pnp transistor. A collector output of the pnp transistor is connected to a base of the npn transistor to constitute a positive feedback path and is divided and is connected to an emitter of the npn transistor to constitute a negative feedback path. An amplification factor A of the emitter earth type amplifying circuit and voltage dividing ratio $\beta$ is set to be $(1+A\beta)<A$.

5 Claims, 2 Drawing Sheets

NEGATIVE RESISTANCE CIRCUIT

BACKGROUND OF THE INVENTION

1. Field of the Invention

The present invention relates to an improved circuit construction techniques of a negative resistance circuit.

2. Description of the Related Art

Since a negative resistance circuit is utilized to improve Q of a tuning circuit, to compensate transmission loss of a transmission line and to constitute an oscillation circuit, it requires that design is easy, circuit construction is simple and it operates stably to high frequency.

A conventional negative resistance circuit employs various construction but each of them has the following defects.

Firstly, in a negative resistance circuit using a negative resistance element such as an ESAKI diode a desired resistance value can not be set.

Nextly, there is a negative resistance circuit using a multivibrator circuit wherein a loop gain is set not to oscillate the multivibrator circuit by inserting a resistor into an emitter circuit thereof but since gain of an internal amplifier therein can not be made large, a set negative resistance value thereof is easily influenced by means of change of temperature, source voltage, etc.

SUMMARY OF THE INVENTION

The object of the present invention is to provide a negative resistance circuit which is not influenced by means of change of temperature, source voltage, etc., and further has simple circuit construction in order to solve defects of a conventional circuit described above.

In order to attain the above object, a negative resistance circuit of the present invention comprises subtracting means to which an input signal is applied, amplifying means for amplifying an output signal of the subtracting means, positive feedback means for positively feeding back an output signal of the amplifying means to an input of the subtracting means, dividing means for dividing the output signal of the amplifying means, and negative feedback means for negatively feeding back a divided output signal of the dividing means. Further, in the negative resistance circuit, dividing ratio of the dividing means and amplification factor of the amplifying means are set to provide negative resistance between an input of the subtracting means and earth.

The negative resistance circuit of the present invention can employ the following constructions.

(1) The subtracting means is constituted by a collector-emitter dividing type amplifying circuit comprising of a npn transistor, and the amplifying means is constituted by an emitter earth type amplifying circuit comprising of a pnp transistor. The input signal is applied to a base of the npn transistor and a collector output thereof is connected to a base of the pnp transistor to take out it as said output signal.

(2) The subtracting means is constituted by a collector-emitter dividing type amplifying circuit comprising of a pnp transistor and the amplifying means is constituted by an emitter earth type amplifying circuit comprising of a npn transistor. The input signal is applied to a base of the pnp transistor and a collector output thereof is connected to a base of the npn transistor to take out it as said output signal.

(3) The subtracting circuit is constituted by a collector-emitter dividing type amplifying circuit comprising of a first transistor and the amplifying means is constituted by an emitter earth type amplifying circuit comprising of a second transistor. The input signal is applied to a base of the first transistor and a collector output thereof is connected capacitively to a base of the second transistor to take out it as said output signal.

(4) The subtracting means is constituted by a drain-source dividing type amplifying circuit comprising of a first FET transistor and the amplifying means is constituted by a source earth type amplifying circuit comprising of a second FET transistor. The input signal is applied to a gate of the first FET transistor and an output thereof is connected to a gate of the second FET transistor to take out it as said output signal.

DESCRIPTION OF THE PREFERRED EMBODIMENTS

Figure 1:
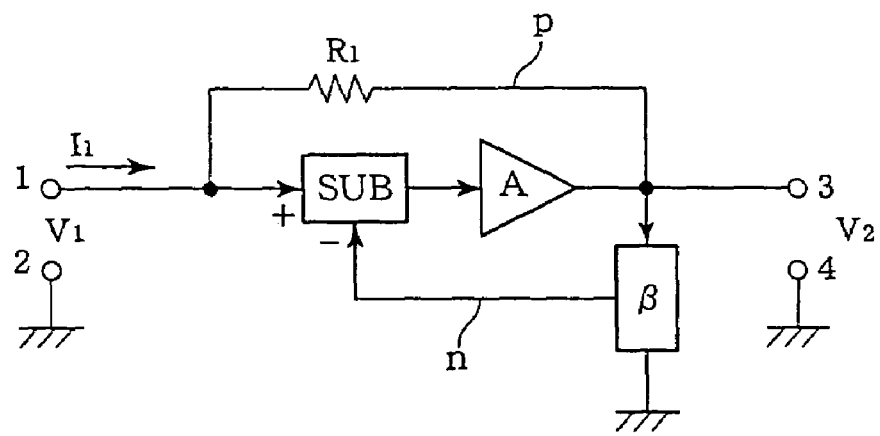
FIG. 1 is a block diagram showing basic functional circuit construction of a negative resistance circuit of the present invention.

FIG. 1 is a block diagram showing a basic functional circuit construction of a negative resistance circuit of the present invention and reason that thin circuit provides a negative resistance will be explained as follows. In FIG. 1, 1, 2 are input terminals of a negative resistance circuit, SUB is a subtracting circuit, A is an internal amplifier having amplification factor A, $\beta$ is a voltage divider having voltage dividing ratio $\beta$ of an output voltage, 3, 4 are output terminals of an amplified output of the negative resistance circuit, $I_1$ is an input current, $V_1$ is an input voltage, $V_2$ is the output voltage, p is a positive feedback path and n is a negative feedback path.

In a circuit having construction of FIG. 1, the following equation is realized.

$$I_1 = (V_1 - V_2)/R_1 \quad (1)$$

$$V_2 = (V_1 - V_2\beta)A \quad (2)$$

From the equations (1) and (2) an input resistance $R_N$ when seeing from the input terminals in right direction is represented by the following equation (3).

$$R_N = \frac{V_1}{I_1} = \frac{R_1(1 + A\beta)}{(1 + A\beta) - A} \quad (3)$$

Therefore, if the circuit is set so as to realize the following equation (4), $R_N$ becomes a negative resistance.

$$(1+A\beta) < A \quad (4)$$

That is, if the voltage dividing ratio $\beta$ of the voltage divider and the amplification factor A of the internal amplifier is set so as to satisfy the equation (4), the negative resistance $R_N$ can be realized between the input terminals 1, 2.

Figure 2:
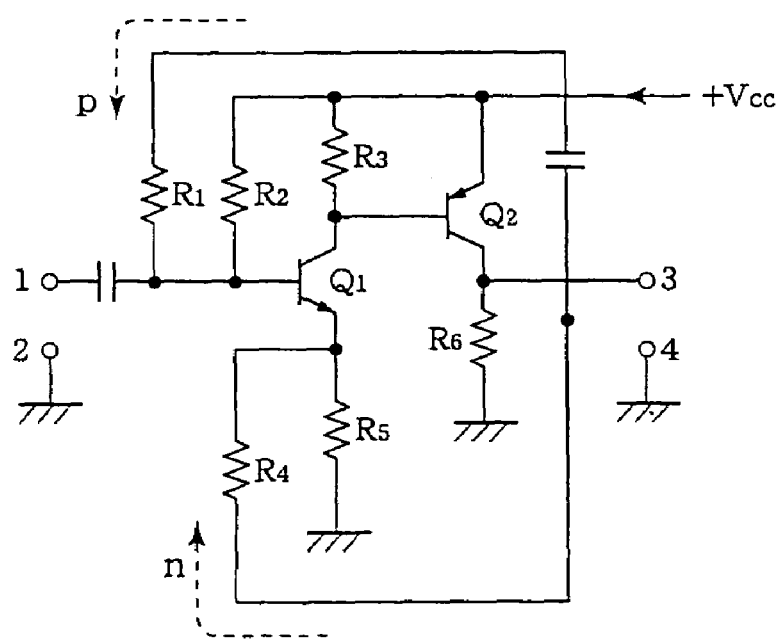
FIG. 2 is a circuit diagram showing an embodiment of the present invention.
Figure 3:
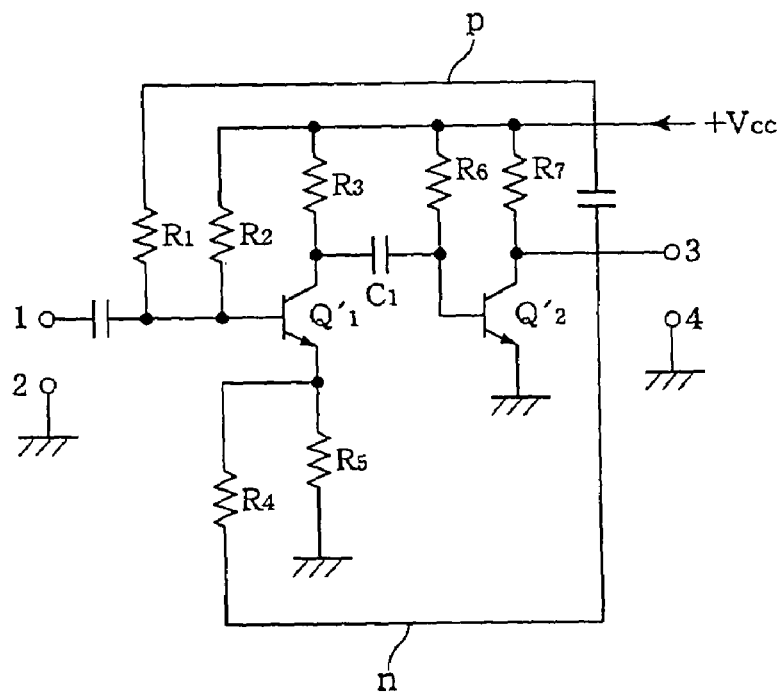
FIG. 3 is a circuit diagram showing other embodiment of the present invention.
Figure 4:
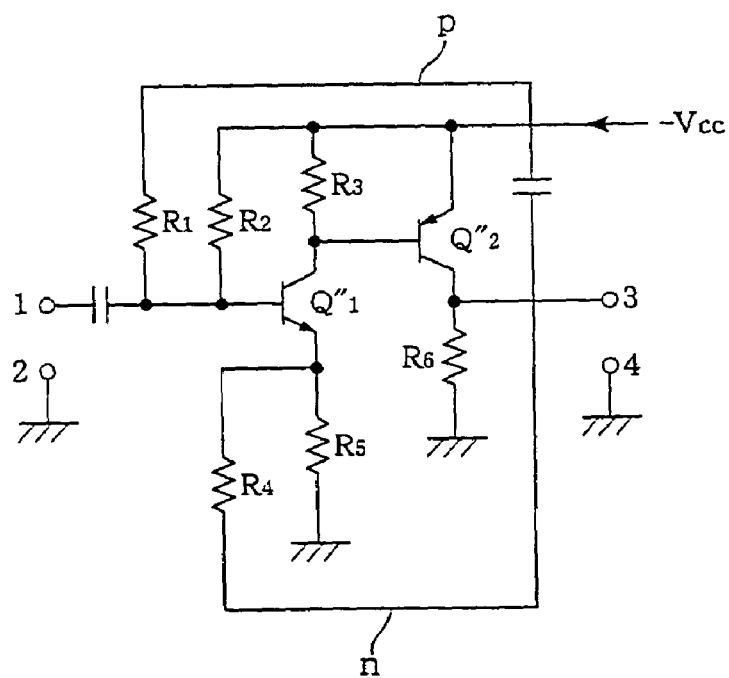
FIG. 4 is a circuit diagram showing further other embodiment of the present invention.

FIGS. 2 to 4 show embodiments of the negative resistance circuits of the present invention respectively. In the embodiment of FIG. 2, $Q_1$ is a npn transistor of a first stage to constitute a collector-emitter dividing type amplifying circuit corresponding to the subtracting circuit and $Q_2$ is a pnp transistor of a second stage to constitute an emitter earth type amplifying circuit corresponding to the internal amplifier. The input signal from the input terminals 1, 2 are applied to a base of the transistor $Q_1$ and a collector output of $Q_1$ is connected to a base of $Q_2$ directly.

The collector output of the transistor $Q_2$ is positively fed back to the base of $Q_1$ through the positive feedback path p. Also, the collector output is negatively fed back to the emitter of the transistor $Q_1$ through the negative feedback path n and negative feedback quantity (divided voltage) is determined by the dividing ratio β of the resistors $R_4$, $R_5$, $R_6$. That is, the resistors $R_4$, $R_5$, $R_6$ constitute said voltage divider.

If the amplification factor A of the emitter earth type amplifying circuit ($Q_2$) and the dividing ratio β of the voltage divider are set so as to satisfy the equation (4), the negative resistance $R_N$ can be obtained between the terminals 1, 2. According to this construction sufficient amplifying gain and broad band characteristic are obtained surely by the emitter earth type amplifying circuit ($Q_2$).

In the embodiment of FIG. 3, a transistor $Q'_1$ constituting a collector-emitter dividing type amplifying circuit and a transistor $Q'_2$ constituting an emitter earth type amplifying circuit are npn transistors. A collector output of the transistor $Q'_1$ is coupled with a base of the transistor $Q'_2$ through $C_1$ and the other construction is the same as that in FIG. 2.

In the embodiment of FIG. 4, $Q''_1$ is a pnp transistor and $Q''_2$ is a npn transistor and the other construction is the same as that in FIG. 2. Further, in each embodiment bi-polar transistors are used but in place of this a field effect transistor (FET) may be used. In this case, a collector, abase and an emitter of the bi-polar transistor may corresponds to a drain, a gate and a source of the field effect transistor respectively and an example of the circuit construction is as follows.

That is, a first stage circuit is constituted by a drain-source dividing type amplifying circuit comprising of a n channel field effect transistor and a second stage circuit is constituted by a source earth type amplifying circuit comprising of a p channel field effect transistor. A source output of the first stage circuit is connected to an input terminal of a negative resistance circuit and a drain output thereof is connected to a gate of the second stage circuit respectively. A source output of the second stage circuit is taken out from the output terminal as an amplified output of the negative resistance circuit and the amplified output is divided. A divided output is connected to a source of the first stage FET transistor through a resistor to constitute a negative feedback path.

According to the above described construction, a negative resistance can be provided at a source terminal of the first FET transistor and an amplified output can be obtained at a drain output of the second stage FET transistor.

As described above, according to the present invention, since an internal amplifier having sufficient amplification factor can be used, a negative resistance circuit which is not influenced by means of change of temperature and source voltage and has simple and broad band circuit construction, can be constituted, it can be applied to improvement of selectivity of a tuning circuit, an oscillation circuit and compensation of loss of transmission characteristic, etc.

What is claimed is:

1. A negative resistance circuit comprising:
    subtracting means to which an input signal is applied;
    amplifying means for amplifying an output signal of the subtracting means;
    positive feedback means for positively feeding back an output signal of the amplifying means to an input of the subtracting means;
    dividing means for dividing the output signal of the amplifying means;
    negative feedback means for negatively feeding back a divided output signal of the dividing means; and
    dividing ratio of the dividing means and amplification factor of the amplifying means being set to provide negative resistance between an input of the subtracting means and earth.

2. A negative resistance circuit according to claim 1 wherein the subtracting means is constituted by a collector-emitter dividing type amplifying circuit comprising a npn transistor, and the amplifying means is constituted by an emitter earth type amplifying circuit comprising a pnp transistor, the input signal being applied to a base of the npn transistor, a collector output thereof being connected to a base of the pnp transistor as said output signal.

3. A negative resistance circuit according to claim 1 wherein the subtracting means is constituted by a collector-emitter dividing type amplifying circuit comprising a pnp transistor and the amplifying means is constituted by an emitter earth type amplifying circuit comprising a npn transistor, the input signal being applied to a base of the pnp transistor, a collector output thereof being connected to a base of the npn transistor as said output signal.

4. A negative resistance circuit according to claim 1 wherein the subtracting circuit is constituted by a collector-emitter dividing type amplifying circuit comprising a first transistor and the amplifying means is constituted by an emitter earth type amplifying circuit comprising a second transistor, the input signal being applied to a base of the first transistor, a collector output thereof being connected capacitively to a base of the second transistor as said output signal.

5. A negative resistance circuit according to claim 1 wherein the subtracting means is constituted by a drain-source dividing type amplifying circuit comprising a first FET transistor and the amplifying means is constituted by a source earth type amplifying circuit comprising a second FET transistor, the input signal being applied to a gate of the first FET transistor, an output thereof being connected to a gate of the second FET transistor as said output signal.

* * * * *